United States Patent [19]

Van Tuijl

[11] Patent Number: 4,661,781
[45] Date of Patent: Apr. 28, 1987

[54] AMPLIFIER WITH FLOATING INVERTING AND NON-INVERTING INPUTS AND STABILIZED DIRECT OUTPUT VOLTAGE LEVEL

[75] Inventor: Adrianus J. M. Van Tuijl, Nijmegen, Netherlands

[73] Assignee: U.S. Philips Corporation, New York, N.Y.

[21] Appl. No.: 703,146

[22] Filed: Feb. 19, 1985

[30] Foreign Application Priority Data

Feb. 29, 1984 [NL] Netherlands .................. 8400633

[51] Int. Cl.⁴ .................................. H03F 3/45
[52] U.S. Cl. ............................ 330/255; 330/146; 330/257
[58] Field of Search ............... 330/146, 255, 257, 311

[56] References Cited

U.S. PATENT DOCUMENTS 4,406,990 9/1983 Noro .......................... 330/311 X Primary Examiner—James B. Mullins
Attorney, Agent, or Firm—Thomas A. Briody; William J. Streeter; Leroy Eason

[57] ABSTRACT

An amplifier having floating inverting and non-inverting inputs and a stabilized direct output voltage level. The amplifier comprises a preamplifier (10) and an output amplifier stage (20). The preamplifier (10) comprises a differential amplifier which comprises a first and a second transistor ($T_1$, $T_2$) between whose emitters a first resistor ($R_1$) is arranged and whose emitters are connected to the positive direct power-supply terminal (2) by a first and a second current source ($I_1 = I$, $I_2 = I$) respectively. The collector of the second transistor ($T_2$) is connected to the negative power-supply terminal (3) via a third current source ($I_3 = 3.5I$) and is coupled to the output (7) of the arrangement via a second resistor ($R_2$). Two transistors ($T_3$, $T_4$) having commoned bases carrying a reference voltage ($V_R$) are arranged in cascade with the third current source ($I_3$). The collectors of these transistors are connected to the positive power-supply terminal (2) via a fourth and a fifth current source ($I_4 = I$, $I_5 = I$) respectively and are coupled to the first and the second input (5,6) of the output amplifier (20) respectively. This output amplifier (20) comprises two opposite conductivity type transistors ($T_5$, $T_6$) whose collectors are connected to the output (7). The resistance value of the second resistor ($R_2$) is such that the direct voltage at the output (7) as a result of the current flowing through this resistor ($R_2$) in the quiescent state is equal to half the supply voltage.

8 Claims, 3 Drawing Figures

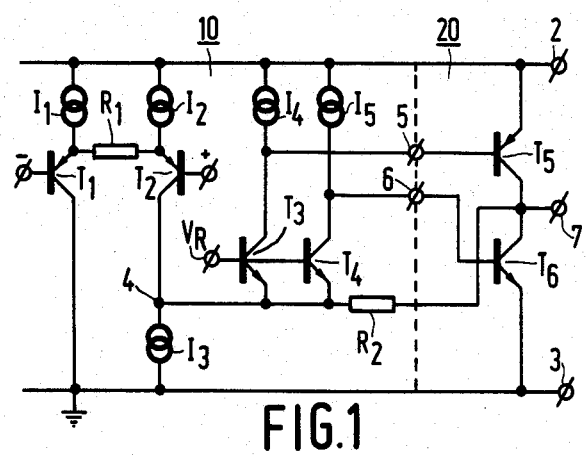
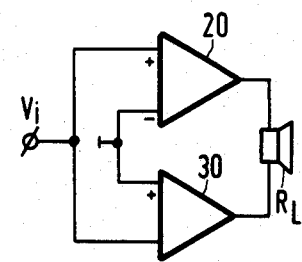
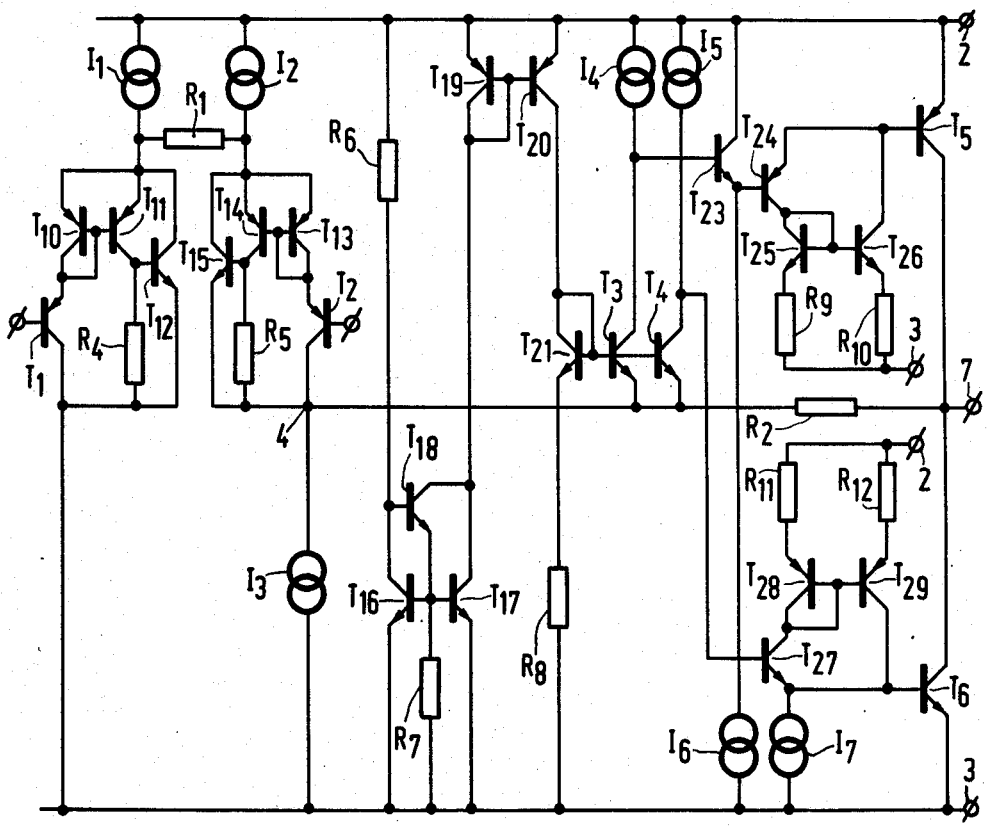
FIG.1
FIG.3
FIG.2

AMPLIFIER WITH FLOATING INVERTING AND NON-INVERTING INPUTS AND STABILIZED DIRECT OUTPUT VOLTAGE LEVEL

BACKGROUND OF THE INVENTION

1. Field of the Invention

The invention relates to an amplifier arrangement having an inverting and a non-inverting input and an output, which arrangement comprises between a first and a second power-supply terminal:

a preamplifier comprising a first and a second transistor which are arranged as a differential pair and whose emitters are coupled to the first power-supply terminal by means of a first current source, the base of the first transistor being coupled to the inverting input and the base of the second transistor to the non-inverting input of the amplifier arrangement, which preamplifier has a first and a second output, and an output amplifier comprising a third and a fourth transistor of opposite conductivity types, whose collector-emitter paths are arranged in series between the two power-supply terminals, a similar electrode of each transistor being coupled to the output of the amplifier arrangement, the base of the third transistor being coupled to the first output of the preamplifier and the base of the fourth transistor to the second output of the preamplifier.

Such an amplifier arrangement may be used for a variety of purposes and, in particular, in audio circuitry.

2. Description of the Related Art

Such an amplifier arrangement of a circuit design which is customary in recent amplifier circuits is disclosed in German Patent Specification No. 31 36 284. The non-inverting input of this amplifier arrangement is biassed to half the supply voltage by a voltage divider arranged between the power-supply terminals. In order to ensure that the output of the amplifier arrangement is also at half the supply voltage a negative-feedback network is arranged between the outtput and the inverting input of the amplifier arrangement. This negative-feedback network, which is often external to the integrated circuit, comprises a voltage divider using a non-integrable electrolytic capacitor. This capacitor provides full d.c. negative feedback so that the output and the inverting input are also at half the supply voltage. For the frequency spectrum of the signals to be amplified said capacitor constitutes practically a short-circuit, so that the negative-feedback network provides a signal negative feedback.

Apart from the fact that the capacitor in the negative-feedback network cannot be integrated the negative feedback has the disadvantage that the inverting input of the amplifier then becomes a low-impedance input. As a result of this, the input signal may not be applied both to the non-inverting and to the inverting amplifier in so-called bridge amplifiers to which a load is connected between the outputs of an inverting and a non-inverting amplifier arrangement. Therefore, the output signal of the non-inverting amplifier is generally applied to the inverting amplifier via a voltage divider. However, this has the disadvantage that the output signals of the inverting and the non-inverting amplifier are subjected to time delays, which may lead to distortion of the output signal of the entire amplifier.

SUMMARY OF THE INVENTION

It is the object of the invention to provide an amplifier arrangement which does not have these disadvantages. According to the invention an amplifier arrangement of the type specified in the opening paragraph is characterized in that the collector of the first transistor is connected to the second power-supply terminal, the collector of the second transistor is coupled to the second power-supply terminal by means of a second current source and to the output of the amplifier arrangement by means of a first resistor, the emitters of a fifth and a sixth transistor whose base-emitter paths are connected in parallel with each other are connected to the output of the second current source, the bases of said transistors being at a reference voltage and the collectors being connected to the first power-supply terminal by means of a third and a fourth current source respectively and being also coupled to the first and the second output of the preamplifier stage respectively, and the current carried by the second current source is substantially equal to the sum of the quiescent current flowing in the second transistor, the currents carried by the third and the fourth current source and the current flowing through the first resistor, the resistance value of said first resistor being such that the voltage on the output of the amplifier arrangement is substantially equal to half the supply voltage applied between the power-supply terminals.

In an amplifier arrangement in accordance with the invention there is no negative feedback between the output and the inverting input of the amplifier. As a result of this, both the inverting and the non-inverting input of the amplifier are floating, so that in, for example, bridge arrangements the input signal may be applied directly to the non-inverting input of one amplifier and to the inverting input of the other amplifier. Since no negative feeback network is employed the external capacitor used in this network may also be dispensed with, which reduces the number of external components to be used in the amplifier.

The output of the amplifier is biassed to half the supply voltage by means of the first resistor. The resistance value of this resistor is selected so that the voltage across this resistor added to the voltage across the second current source, which is set to a fixed value by the reference voltage on the bases of the third and the fourth transistor, is equal to half the supply voltage. As this resistor must have a specific value related to the currents carried by the current sources, this resistor is preferably integrated.

An embodiment of the invention may be further characterized in that the emitters of the first and the second transistor are coupled to the first power-supply terminal by means of a current source each and a second resistor is arranged between the emitters of the first and the second transistor.

This second resistor provides negative feedback for the preamplifier, yielding a linear conversion of the input voltage into the output current of the preamplifier. The overall gain of the amplifier then depends on the ratio between the resistance values of the first and the second resistor, the gain being variable by selection of the resistance value of the second resistor. In the case of a fixed value of the gain the second resistor is preferably integrated.

This or another embodiment of the invention may be further characterized in that the first and the second transistor are each constructed as a compound transistor comprising an input transistor whose emitter is connected to the input of a current amplifier whose output drives the base of an output transistor of a conductivity type opposite to that of the input transistor and whose emitter is connected to the collector of the first transistor. This embodiment may be characterized further in that the current amplifier comprises a current-mirror circuit comprising a seventh transistor connected as a diode and an eighth transistor whose base-emitter junction is connected in parallel with that of the seventh transistor.

Owing to use of current amplification the input transistors of the preamplifier can handle large currents without giving rise to large input base currents. This embodiment may be characterized further in that a current-determining resistor which defines the currents through the seventh and the eighth transistor is arranged between the base and the emitter of the output transistor.

The above or other embodiments of the invention may be further characterized in that the currents carried by the first, the second, the third and the fourth current source increase directly proportionally to the supply voltage and the voltage across the second current source increases directly proportionally to the supply voltage. In this way it is accomplished that if the supply voltage increases the resistance value of the first resistor required to set the voltage on the output to half the supply voltage remains the same. In this embodiment the voltage across the second current source can be made to increase directly proportionally to the supply voltage by generating the reference voltage on the base of the fifth and the sixth transistor by means of a current which increases directly proportionally to the supply voltage and which flows in the series arrangement of a diode-connected transistor and a third resistor, the base of said diode-connected transistor being connected to the bases of the fifth and the sixth transistor.

BRIEF DESCRIPTION OF THE DRAWINGS

The invention will now be described in more detail, by way of example, with reference to the drawing, in which:

FIG. 1 is the circuit diagram of an amplifier arrangement in accordance with the invention, FIG. 2 shows another form of the arrangement shown in FIG. 1, and FIG. 3 shows a bridge amplifier comprising amplifier arrangements in accordance with the invention.

DESCRIPTION OF THE PREFERRED EMBODIMENTS

FIG. 1 is the circuit diagram of an amplifier arrangement in accordance with the invention. The arrangement comprises a preamplifier 10 which comprises a differential amplifier comprising transistors $T_1$ and $T_2$, the base of transistor $T_1$ constituting the inverting input and the base of transistor $T_2$ constituting the non-inverting input of the amplifier arrangement. A negative feedback resistor $R_1$ is arranged between the emitters of the transistors $T_1$ and $T_2$. The emitters of the transistors $T_1$ and $T_2$ are coupled to the positive power-supply terminal 2 by a current source $I_1=I$ and a current source $I_2=I$ respectively. At rest no current will flow through resistor $R_1$, so that the bases of transistors $T_1$ and $T_2$ can be driven up to substantially the value of the positive supply voltage minus one base-emitter voltage if the saturation voltages of the current sources $I_1$ and $I_2$ are ignored. The collector of transistor $T_1$ is connected to the negative power-supply terminal 3, in the present case earth. The collector of transistor $T_2$ is connected to earth by means of a current source $I_3=3.5I$. Two transistors $T_3$ and $T_4$ with parallel-connected base-emitter junctions are connected to the output of the current source $I_3$ with their emitters. The commoned bases of transistors $T_3$ and $T_4$ are at a reference voltage $V_R$, which is preferably selected so that a small voltage is produced across the current source $I_3$ which voltage is such that this current source is not turned off. This results in an optimum voltage swing for transistor $T_2$. The collector of transistor $T_3$ is connected to the positive power-supply terminal 2 via a current source $I_4=I$ and is also coupled to the output 5 of the preamplifier. Similarly, the collector of transistor $T_4$ is connected to a current source $I_5=I$ and is also coupled to the output 6 of the preamplifier. The collector of transistor $T_2$ is connected to the output 7 of the amplifier arrangement by means of a resistor $R_2$. The output amplifier 20 comprises two transistors $T_5$ and $T_6$ of opposite conductivity types whose collector-emitter paths are arranged in series between the positive and the negative power supply terminal 2 and 3. The collectors of the transistors $T_5$ and $T_6$ are connected to the output 7, to which a load may be connected.

To explain the operation of the arrangement it is assumed that the supply voltage is 3 V, the current $I=100$ μA and the voltage across the current source $I_3$ is 200 mV. If the transistor $T_1$ and $T_2$ are not driven the collector current of transistor $T_2$ will be equal to the current $I_2=100$ μA. This current and the currents $I_4=100$ μA and $I_5=100$ μA are drained completely by the current source $I_3=350$ μA, the residual current of 50 μA for the current source $I_3$ being supplied via the resistor $R_2$. In order to ensure that the output 7 of the amplifier arrangement is at half the supply voltage, i.e. 1.5 V, the value of resistor $R_2$ must be $R_2=(1.5-0.2)/50.10^{-6}=26$ kohms. In this way the output 7 of the amplifier arrangement is held at half the supply voltage without arranging the customary negative-feedback network comprising a non-integrable capacitor between the output and the inverting input of the amplifier. As a result of this, both the non-inverting input and the inverting input are floating and may be driven directly by a source. In this respect it is to be noted that the inverting input can be driven to a voltage lower than the voltage on the negative power-supply terminal 3. This is because transistor $T_1$ may be bottomed, for which the emitter voltage is equal to the negative supply voltage minus the saturation voltage of transistor $T_1$. The base of transistor $T_1$ is then at a voltage which is one base-emitter voltage lower. The non-inverting input can be driven to a voltage which is equal to the voltage on the output of the current source $I_3$ (200 mV) plus the saturation voltage of transistor $T_2$ minus its base-emitter voltage. In order to explain the operation of the arrangement when it is driven, it is assumed that in the present example the non-inverting input is connected to the earth terminal 3 and that the inverting input is driven by a source. If the d.c. level of the source output is not earth potential, a resistor must be arranged between the inverting input and earth and a coupling capacitor must be used. If owing to the drive the voltage on the inverting input for example decreases, transistor $T_1$ will become more conductive and transistor $T_2$ will become less conductive. Initially the additional current required by the current source $I_3$ cannot be supplied via resistor $R_2$ because the voltage on the output 7 will not change initially. At first the current through transistors $T_3$ and $T_4$ therefore increases, which results in an increase of the base current of transistor $T_5$ and a decrease of the base current of transistor $T_6$. Transistor $T_5$ then becomes more conductive, so that the voltage on output 7 increases. The additional current required by the current source $I_3$ can now flow via resistor $R_2$. Conversely, if the voltage on the inverting input increases transistor $T_6$ will become more conductive and transistor $T_5$ will become less conductive, so that the voltage on output 7 decreases. The additional current now supplied by transistor $T_2$ then flows to the output via resistor $R_2$. Thus, transistors $T_5$ and $T_6$ are driven so that an increase of the current in one transistor is accompanied by a decrease of the current in the other transistor. The gain of the amplifier arrangement depends on the ratio between the resistors $R_2$ and $R_1$, the value of the resistor $R_1$ being variable. In the case of a fixed gain both resistors may be integrated, so that the amplifier arrangemennt does not comprise any external components except for a capacitor which may be required for connecting the load.

The circuit arrangement can operate at very low supply voltages up from 1.6 V. The value of the resistor $R_2$ can be rendered independent of the supply voltage by the use of current sources whose output currents are directly proportional to the supply voltage. The reference voltage on the bases of transistors $T_3$ and $T_4$ must then be such that the voltage across the current source $I_3$ also increases proportionally to the supply voltage. It is to be noted that current sources whose output currents increase directly proportionally to the supply voltage are described in pending Patent Application Ser. No. 705,763, filed Feb. 28, 1985 and assigned to the present assignee, and now U.S. Pat. No. 4,605,892.

FIG. 2 shows the arrangement of FIG. 1 in more detail, corresponding parts bearing the same reference numerals. The transistors of the differential amplifier in the preamplifier stage 10 are compound transistors. The emitter of transistor $T_1$ is connected to the input of a current amplifier which comprises a current mirror comprising a diode-connected transistor $T_{10}$ and a transistor $T_{11}$ whose base-emitter junction is arranged in parallel with that of transistor $T_{10}$. The emitter area of transistor $T_{11}$ is larger than that of transistor $T_{10}$, so that the collector current of transistor $T_{11}$ will be larger than the emitter current of transistor $T_{10}$. The collector of transistor $T_{11}$ drives the base of a transistor $T_{12}$ whose emitter is connected to the collector of transistor $T_1$. A resistor $R_4$ is arranged between the base and the emitter of transistor $T_{12}$ and defines the currents in transistors $T_1$, $T_{10}$ and $T_{11}$. The collector of transistor $T_{12}$ forms the emitter, and the emitter of transistor $T_{12}$ forms the collector of this compound transistor. Owing to the current amplification via the current mirror $T_{10}$, $T_{11}$ and via the transistor $T_{12}$, the current from current source $I_1$ is so divided among the transistors $T_1$, $T_{11}$ and $T_{12}$ that a small current flows in transistor $T_1$, a slightly larger current in transistor $T_{11}$ and a substantially larger current in transistor $T_{12}$. For a current $I_1 = 100$ μA and a ratio of 1:5 between the emitter areas of the transistors $T_1$ and $T_{11}$ these currents are for example 2 μA, 10 μA and 88 μA respectively. Owing to the small emitter current to transistor $T_1$ the base current of this transistor will also be very small. As a result of this small base current transistor $T_1$ will hardly load the source when the amplifier is driven. In the same way as transistor $T_1$, transistor $T_2$ is a compound transistor comprising transistors $T_{13}$, $T_{14}$, $T_{15}$ and resistor $R_5$. The reference voltage $V_R$ is generated by means of a current source comprising a resistor $R_6$ which is arranged between the positive and the negative power-supply terminal 2 and 3 in series with the collector-emitter path of a transistor $T_{16}$. Transistor $T_{16}$ forms part of a current-mirror circuit comprising transistors $T_{16}$, $T_{17}$ and $T_{18}$. However, instead of being connected to the positive power-supply terminal 2 in the customary manner, the collector of transistor $T_{18}$ is connected to the collector of transistor $T_{17}$. Moreover, a resistor $R_7$ is connected in parallel with the base-emitter path of transistor $T_{16}$, which resistor has a resistance value equal to half the resistance value of the resistor $R_6$. Owing to these steps the common collector current of the transistors $T_{17}$ and $T_{18}$ is equal to the quotient of the supply voltage and the resistance value of resistor $R_6$. By means of the current mirror comprising transistors $T_{19}$ and $T_{20}$ this current is reproduced and passed through the series arrangement of a diode-connected transistor $T_{21}$ and a resistor $R_8$. The base of transistor $T_{21}$ is connected to the bases of transistors $T_3$ and $T_4$. It is to be noted that the current sources $I_1$, $I_2$, $I_4$ and $I_5$ can be formed by connecting transistors in parallel with transistor $T_{20}$, and the current source $I_3$ can similarly be controlled by the current source $R_6$, $R_7$, $T_{16}$ to $T_{18}$. If the currents through transistor $T_{21}$ and transistor $T_3$ are equal, the base-emitter voltages of these transistors will also be equal, so that the voltage across the current source $I_3$ will be equal to the voltage across the resistor $R_8$. As the current through resistor $R_8$ increases directly proportionally to the supply voltage, the voltage across the current source $I_3$ will also increase in direct proportion to the supply voltage. This ensures that for the same resistance value of resistor $R_2$ the voltage on the output 7 remains equal to half the supply voltage when the supply voltage increases. Another method of generating the reference voltage is described in pending Patent Application Ser. No. 703,147 filed simultaneously with the present Application and assigned to the present assignee, and now U.S. Pat. No. 4,591,804.

The output transistors of the amplifier arrangement are constructed as a special type of Darlington arrangement which forms the subject of a pending Patent Application Ser. No. 706,066 filed Feb. 27, 1985 and assigned to the present assignee. Transistor $T_5$ is driven via an emitter follower transistor $T_{23}$ by means of a current source and emitter follower transistor $T_{24}$. The collector of transistor $T_{24}$ is connected to the input of a current-mirror circuit comprising a diode-connected transistor $T_{25}$ whose emitter is connected to the negative power-supply terminal 3 via a resistor $R_9$ and a transistor $T_{26}$ whose base is connected to the base of transistor $T_{25}$ and whose emitter is connected to the negative power-supply terminal 3 via a resistor $R_{10}$. The emitter area of transistor $T_{26}$ is larger than that of transistor $T_{25}$ and the resistance value of resistor $R_{10}$ is substantially smaller than that of resistor $R_9$. As a result of this, the current gain in the current-mirror circuit for small currents will be comparatively low and is determined by the ratio between the emitter areas of the transistors $T_{26}$ and $T_{25}$ and the current gain for large currents will be comparatively high and is determined by the ratio between the values of the resistors $R_9$ and $R_{10}$, which ratio is larger than the ratio between the emitter areas. Thus, in the case of larger currents extra base current is supplied to transistor $T_5$, thereby compensating for the decreasing current gain factor of output transistor $T_5$ for large currents. Transistor $T_6$ is driven by a transistor $T_{27}$ which is arranged as an emitter follower by means of current source $I_7$ and whose collector current is amplified in the same way as that of transistor $T_6$ by means of a current mirror comprising transistors $T_{28}$, $T_{29}$ and resistors $R_{11}$ and $R_{12}$, which collector current is applied to the base of transistor $T_6$ together with the emitter current of transistor $T_{27}$.

As stated in the foregoing, one of the great advantages of the amplifier arrangement in accordance with the invention is that both inputs of the preamplifier stage are floating owing to the absence of negative feedback from the output to the inverting input. This allows both the inverting and the non-inverting input to be driven directly by a signal source, which is important inter alia in so-called bridge amplifiers. FIG. 3 shows the circuit diagram of such a bridge amplifier. The amplifiers 20 and 30 are of the type shown in FIGS. 1 and 2. The inverting input of amplifier 20 is connected to earth and its non-inverting input is connected to the source of input voltage $V_i$, whilst the non-inverting input of amplifier 30 is connected to earth and its inverting input is connected to the source of input voltage $V_i$. A load $R_L$, in the present case a loudspeaker, is connected to the outputs of the amplifiers 20 and 30. The bridge circuit does not require any external components.

The invention is not limited to the embodiments shown. Instead of in common-emitter arrangement the output transistors may also be operated in common-collector arrangement. Moreover, the other transistors of the arrangement may be replaced in known manner by transistors of the opposite conductivity type. Further, the amplifier may be operated as a class-AB amplifier with quiescent-current setting as described in for example pending Patent Application Ser. No. 706,375, filed Feb. 27, 1985, and assigned to the present assignee.

What is claimed is:

1. An amplifier arrangement having an inverting and a non-inverting input and an output, which arrangement comprises, connecting between a first and a second terminal of a direct current power supply:

a preamplifier comprising a first transistor ($T_1$) and a second transistor ($T_2$) which are arranged as a differential pair, the emitter of the first transistor being coupled to the first power-supply terminal by means of a first current source ($I_1$), the base of the first transistor being coupled to the inverting input and the base of the second transistor to the non-inverting input of the amplifier arrangement, which preamplifier has a first and a second output, an output amplifier comprising a third transistor ($T_5$) and a fourth transistor ($T_6$) of opposite conductivity types, whose collector-emitter paths are arranged in series between the two power-supply terminals, a similar electrode of each of the third and fourth transistors being coupled to the output of the amplifier arrangement, the base of the third transistor being coupled to the first output and the base of the fourth transistor to the second output of the preamplifier, the collector of the first transistor ($T_1$) being connected to the second power-supply terminal, the collector of the second transistor ($T_2$) being coupled to the second power-supply terminal by means of a second current source ($I_3$) and to the output of the amplifier arrangement by means of a first resistor ($R_2$), the emitters of a fifth transistor ($T_3$) and a sixth transistor ($T_4$), whose base-emitter paths are connected in parallel with each other, being connected to the second current source ($I_3$), the bases of said fifth and sixth transistors being at a reference voltage ($V_R$), and the collectors thereof being connected to the first power-supply terminal by means of third and fourth current sources ($I_4$, $I_5$) respectively and being also respectively coupled to the first and second outputs of the preamplifier stage respectively; the current carried by the second current source ($I_3$) being substantially equal to the sum of the quiescent current flowing in the second transistor ($T_2$), the currents carried by the third and the fourth current sources ($I_4$, $I_5$) and the current flowing through the first resistor ($R_2$); the resistance of said first resistor being such that the direct voltage at the output of the amplifier arrangement is substantially equal to half the direct voltage supplied between the power-supply terminals.

2. An amplifier arrangement as claimed in claim 1, characterized in that the emitter of the second transistor ($T_2$) is coupled to the first power-supply terminal by means of a current source ($I_2$) and a second resistor ($R_1$) is arranged between the emitters of the first and the second transistor.

3. An amplifier arrangement as claimed in claim 1 or 2, characterized in that each of the first and the second transistors ($T_1$, $T_2$) is constructed as a compound transistor comprising an input transistor ($T_1$, $T_2$) whose emitter is connected to the input of a current amplifier ($T_{10}$, $T_{11}$ or $T_{13}$, $T_{14}$) whose output drives the base of an output transistor ($T_{12}$ or $T_{15}$) of a conductivity type opposite to that of the input transistor, the emitter of the output transistor being connected to the collector of the input transistor.

4. An amplifier arrangement as claimed in claim 3, characterized in that the current amplifier comprises a current-mirror circuit comprising a seventh transistor ($T_{10}$ or $T_{13}$) connected as a diode and an eighth transistor ($T_{11}$ or $T_{14}$) whose base-emitter junction is connected in parallel with that of the seventh transistor.

5. An amplifier arrangement as claimed in claim 4, characterized in that a current-determining resistor ($R_4$ or $R_5$) which defines the currents through the seventh transistor ($T_{10}$ or $T_{13}$) and the eighth transistor ($T_{11}$ or $T_{14}$) is arranged between the base and the emitter of the output transistor ($T_{12}$ or $T_{15}$).

6. An amplifier arrangement as claimed in claim 2 characterized in that the currents carried by the first, the second, and third and the fourth current source increase directly proportionally to the supply voltage and the voltage across the second current source increases directly proportionally to the supply voltage.

7. An amplifier arrangement as claimed in claim 6, charactrized in that the reference voltage ($V_R$) at the bases of the fifth and the sixth transistors ($T_3$, $T_4$) is generated by means of a current which increases directly proportionally to the supply voltage and which flows in the series arrangement of a diode-connected transistor ($T_{21}$) and a third resistor ($R_8$), the base of said diode-connected transistor ($T_{21}$) being connected to the bases of the fifth and sixth transistors ($T_3$, $T_4$).

8. An amplifier arrangement as claimed in claim 1, characterized in that the third and fourth transistors ($T_5$, $T_6$) are Darlington transistors.

* * * * *